US011099592B2

(12) United States Patent
Wang et al.

(10) Patent No.: US 11,099,592 B2
(45) Date of Patent: Aug. 24, 2021

(54) CURRENT SELF-CHECKING REGULATION CIRCUIT BASED ON VOLTAGE CALIBRATION

(71) Applicant: AmpliPHY Technologies Limited, Hangzhou (CN)

(72) Inventors: Chih-yang Wang, Hangzhou (CN); Yichao He, Hangzhou (CN)

(73) Assignee: AMPLIPHY TECHNOLOGIES LIMITED, Hangzhou (CN)

( * ) Notice: Subject to any disclaimer, the term of this patent is extended or adjusted under 35 U.S.C. 154(b) by 0 days.

(21) Appl. No.: 16/246,573

(22) Filed: Jan. 14, 2019

(65) Prior Publication Data

US 2020/0089267 A1 Mar. 19, 2020

(30) Foreign Application Priority Data

Sep. 18, 2018 (CN) .......................... 201811086962.8

(51) Int. Cl.
*H01S 3/00* (2006.01)
*G05F 3/26* (2006.01)
*H01S 5/042* (2006.01)
*H01S 5/183* (2006.01)

(52) U.S. Cl.
CPC .............. *G05F 3/262* (2013.01); *H01S 5/042* (2013.01); *H01S 5/183* (2013.01)

(58) Field of Classification Search
CPC .. H01S 5/06–5/0687; G05F 3/02; G05F 3/08; G05F 3/262; G05F 3/26; G05F 1/462; G05F 1/10; G05F 1/56; G05F 1/46
See application file for complete search history.

(56) References Cited

U.S. PATENT DOCUMENTS 5,514,989 A * 5/1996 Sato ...................... H03K 17/60
327/109
6,516,015 B1 * 2/2003 Kimura ................... H01S 5/042
372/29.01

(Continued)

FOREIGN PATENT DOCUMENTS

| CN | 109066290 | * 12/2018 | ............. H01S 5/042 |
| JP | 02005101154 | * 4/2005 | ............. H01S 5/042 |
| TW | 201351083 | * 12/2019 | ............... G05F 1/10 |

*Primary Examiner* — Minsun O Harvey
*Assistant Examiner* — Delma R Fordé
(74) *Attorney, Agent, or Firm* — Bayramoglu Law Offices LLC

(57) ABSTRACT

This invention provides a current self-checking regulation circuit based on voltage calibration including a bandgap reference unit, a self-calibration unit, a detection and regulation unit, current mirror units, and a current mirror control unit. The bandgap reference unit is configured to generate a voltage signal, the self-calibration unit is configured to respond to a digital signal of the detection and regulation unit and calibrate the voltage signal of the bandgap reference unit. The detection and regulation unit samples the reference current signal and a mirror current signal of the regulation group current mirror unit and generate a digital control signal according to the reference current signal. and the reference group current mirror unit responds to the digital control signal and outputs a regulated bias current signal meeting needs of the laser driver.

4 Claims, 2 Drawing Sheets

(56) References Cited

U.S. PATENT DOCUMENTS

| | | | | |
|---|---|---|---|---|
| 6,700,423 B1* | 3/2004 | Miki | .................. | H03K 5/04 |
| | | | | 327/172 |
| 7,046,612 B2* | 5/2006 | Suzuki | .................. | H01S 5/042 |
| | | | | 369/116 |
| 7,145,929 B2* | 12/2006 | Bergmann | .............. | G05F 3/265 |
| | | | | 372/38.02 |
| 7,609,735 B2* | 10/2009 | Kubota | .................. | H01S 5/042 |
| | | | | 372/38.02 |
| 2002/0135424 A1* | 9/2002 | Oikawa | .................. | G05F 3/262 |
| | | | | 330/288 |
| 2007/0115227 A1* | 5/2007 | Nishida | .................. | H01S 5/042 |
| | | | | 345/82 |
| 2008/0272708 A1* | 11/2008 | Horiuchi | ................ | H01S 5/042 |
| | | | | 315/224 |
| 2018/0138895 A1* | 5/2018 | Liu | .................. | H03H 11/30 |

* cited by examiner

CURRENT SELF-CHECKING REGULATION CIRCUIT BASED ON VOLTAGE CALIBRATION

CROSS-REFERENCE TO RELATED APPLICATIONS

This Non-provisional application claims priority under 35 U.S.C. § 119(a) on Patent Application No(s). 201811086962.8 filed in People's Republic of China on Sep. 18, 2018, the entire contents of which are hereby incorporated by reference.

BACKGROUND OF THE INVENTION

Field of the Invention

This invention relates to a technical field of optical fiber communication and, more particularly, to a current self-checking regulation circuit based on voltage calibration.

Description of the Related Art

A current drive module in the field of optical fiber communication, such as a vertical cavity surface emitting (VCSEL) laser driver, requires a bias current sources to be stable (not changing with the temperature and process), detectable, and adjustable. Usually, the bias current source is a stable and adjustable 2.5-15 mA current. A solution on the market at present is to add the voltage of an internal bandgap reference source to two ends of an internal resistor to generate a reference current, and the current source mirror control module outputs the reference current to the VCSEL module. However, this reference current needs to be detected and regulated. A common detection method is to pull the bias current of the laser driver to an external resistor (not changing with the temperature), a corresponding voltage signal is generated, and a digital signal is read by an analog-to-digital conversion (ADC) module. The current is calculated by comparing the digital signal generated by the reference voltage of the ADC. The digital signal is then written into the internal current mirror control module through an I2C module, such that a required accurate bias current is generated. However, this solution has the following problems. The internal resistor changes greatly with the temperature and process, such that the reference current will change greatly with the temperature and process; the output of the ADC needs to be calibrated before the current signal is detected.

BRIEF SUMMARY OF THE INVENTION

This invention provides a current self-checking regulation circuit based on voltage calibration to solve the above-mentioned problems.

To solve the above-mentioned problems, an embodiment of this invention provides a current self-checking regulation circuit based on voltage calibration, including a bandgap reference unit, a self-calibration unit, a detection and regulation unit, current mirror units, and a current mirror control unit. The number of the current mirror units is at least two, one of the current mirror units is a reference group current mirror unit, and the rest of the current mirror units is at least one regulation group current mirror unit. The detection and regulation unit is coupled with the bandgap reference unit, the reference group current mirror unit, the regulation group current mirror unit, and the current mirror control unit, the bandgap reference unit is coupled with the self-calibration unit, and the reference group current mirror unit is coupled with the self-calibration unit. The regulation group current mirror unit is coupled with the current mirror control unit, the current mirror control unit is coupled with a laser driver, and the detection and regulation unit is coupled with the reference group current mirror unit, the regulation group current mirror unit, the current mirror control unit, and the self-calibration unit.

The bandgap reference unit is configured to generate a voltage signal, the self-calibration unit is configured to respond to a digital signal of the detection and regulation unit and calibrate the voltage signal of the bandgap reference unit to generate a calibrating voltage signal, and the reference group current mirror unit generates a reference current signal according to the calibrating voltage signal. The detection and regulation unit samples the reference current signal and a mirror current signal of the regulation group current mirror unit and generate a digital control signal according to the reference current signal and the mirror current signal of the regulation group current mirror unit, and the current mirror control unit responds to the digital control signal and outputs a regulated bias current signal meeting needs of the laser driver.

As an implementation way, the detection and regulation unit may include a detection resistor module, an analog-to-digital conversion module, a data communication module, and a microcontroller. The detection resistor module may be coupled with the reference group current mirror unit and the regulation group current mirror unit, the analog-to-digital conversion module may be arranged between the detection resistor module and the data communication module, and the data communication module may be coupled with the microcontroller, the current mirror control unit, and the bandgap reference unit.

When the detection resistor module is turned on and connected with the reference group current mirror unit, according to the reference current signal, a first sampled signal may be generated and inputted into the analog-to-digital conversion module. When the detection resistor module is turned on and connected with the regulation group current mirror unit, according to the mirror current signal, a second sampled signal may be generated and inputted into the analog-to-digital conversion module. According to the first sampled signal and the second sampled signal, the data communication module may complete detection of the mirror current signal, at the same time the microcontroller may communicate with the data communication module to generate a digital control signal, the digital control signal may be transmitted to the current mirror control unit, and the current mirror control unit may respond to the digital control signal and regulate the bias current signal inputted to the laser driver.

As an implementation way, the regulation group current mirror unit may include nine current mirror subunits. One of the current mirror subunits may be coupled with the detection and regulation unit, and the other eight current mirror subunits may be coupled with the current mirror control unit.

Compared with the prior art, beneficial effects of this invention are:

this invention simplifies an entire process of detecting and regulating the current, and does not need to calibrate the ADC before detecting the current; and the reference current generated by the current source is optimized such that the current source does not change with the temperature of the process of the internal resistor, and the internal generated current is consistent with the external read current.

Figure 1:
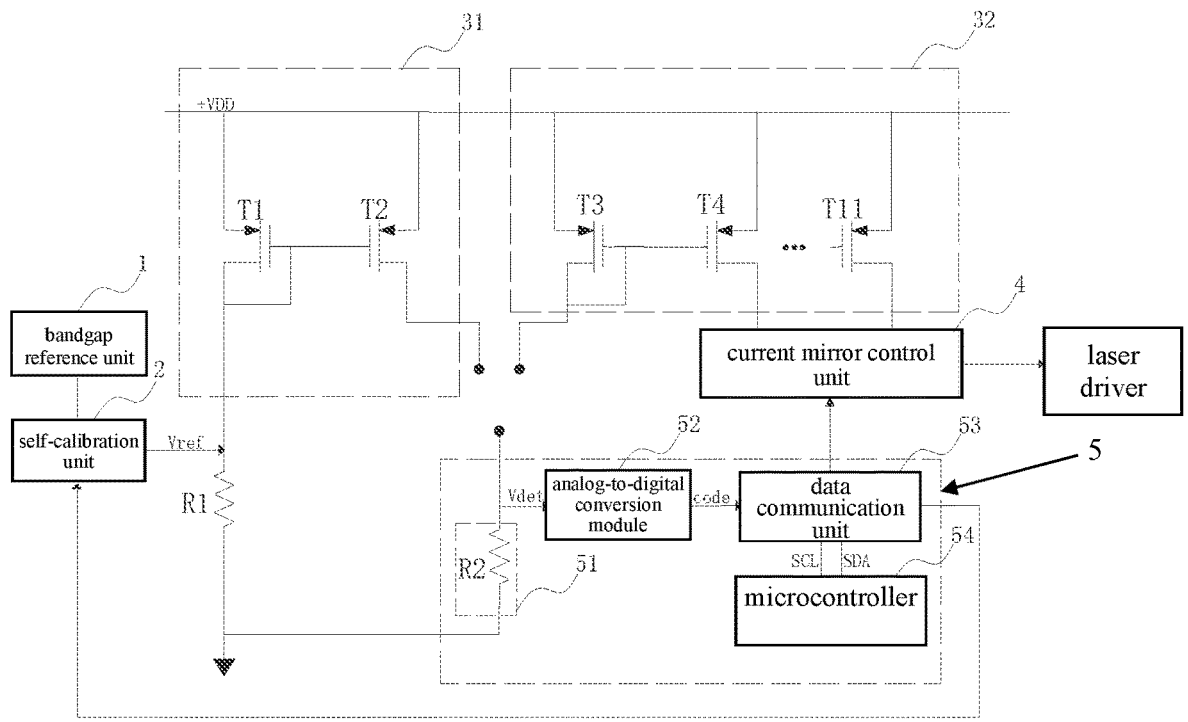
FIG. 1 is a circuit diagram of a current self-checking regulation circuit based on voltage calibration according to this invention.

Figure reference numerals: 1. bandgap reference unit; 2. self-calibration unit; 31. reference group current mirror unit; 32. regulation group current mirror unit; 4. current mirror control unit; 5. detection and regulation unit; 51. detection resistor module; 52. analog-to-digital conversion module; 53. data communication module; and 54. microcontroller.

DETAILED DESCRIPTION OF THE INVENTION

The above and other technical features and advantages of this invention will be clearly and completely described combining with the accompanying drawings hereinafter. Apparently, the described embodiment is merely a part of the embodiments of this invention instead of all the embodiments.

As shown in FIG. 1, a current self-checking regulation circuit based on voltage calibration, includes a bandgap reference unit 1, a self-calibration unit 2, a detection and regulation unit 5, current mirror units, and a current mirror control unit 4. The number of the current mirror units is at least two, one of the current mirror units is a reference group current mirror unit 31, and the rest of the current mirror units is at least one regulation group current mirror unit 32. The detection and regulation unit 5 is coupled with the bandgap reference unit 1, the reference group current mirror unit 31, the regulation group current mirror unit 32, and the current mirror control unit 4. The bandgap reference unit 1 is coupled with the self-calibration unit 2, the reference group current mirror unit 31 is coupled with the self-calibration unit 2, the regulation group current mirror unit 32 is coupled with the current mirror control unit 4, and the current mirror control unit 4 is coupled with a laser driver. The detection and regulation unit 5 is coupled with the reference group current mirror unit 31, the regulation group current mirror unit 32, the current mirror control unit 4, and the self-calibration unit 2.

The bandgap reference unit 1 is configured to generate a voltage signal, and the self-calibration unit 2 is configured to respond to a disital signal of the detection and regulation unit 5 and calibrate the voltage signal of the bandgap reference unit 1 to generate a calibrating voltage signal. The reference group current mirror unit 31 generates a reference current signal according to the calibrating voltage signal, the detection and regulation unit 5 samples the reference current signal and a mirror current signal of the regulation group current mirror unit 32 and generates a digital control signal according to the reference current signal and the mirror current signal of the regulation group current mirror unit 32, and the current mirror control unit 4 responds to the digital control signal and outputs a regulated bias current signal meeting needs of the laser driver.

The self-calibration unit 2 is used to generate a calibrating voltage Vref, and the constant reference current signal is generated through this voltage Vref and an external resistor (i.e. bandgap reference unit 1). Another current is acquired by mirroring this reference current signal, and the current is outputted to a current source mirror control module to generate a 2.5-15 mA bias current source needed by the laser driver. The detection and regulation unit 5 can directly control the current mirror units to be outputted through the mirror current.

In this embodiment, the regulation group current mirror unit 32 includes nine current mirror subunits, one of the current mirror subunits is coupled with the detection and regulation unit 5, and the other eight current mirror subunits are coupled with the current mirror control unit 4. In the figure, the current mirror subunit T3 is coupled with the detection and regulation unit 5.

The detection and regulation unit 5 includes a detection resistor module 51, an analog-to-digital conversion module 52, a data communication module 53, and a microcontroller 54. The detection resistor module 51 is coupled with the reference group current mirror unit 31 and the regulation group current mirror unit 32, the analog-to-digital conversion module 52 is arranged between the detection resistor module 51 and the data communication module 53, and the data communication module 53 is coupled with the microcontroller 54, the current mirror control unit 4, and the bandgap reference unit 1. When the detection resistor module 51 is turned on and connected with the reference group current mirror unit 31, according to the reference current signal, a first sampled signal is generated and inputted into the analog-to-digital conversion module 52; when the detection resistor module 51 is turned on and connected with the regulation group current mirror unit 32, according to the mirror current signal, a second sampled signal is generated and inputted into the analog-to-digital conversion module 52; and the data communication module 53 completes the detection of a value of the mirror current signal according to the first sampled signal and the second sampled signal, at the same time microcontroller 54 communicates with the data communication module 53 to generate the digital control signal, the digital control signal is transmitted into the current mirror control unit 4, and the current mirror control unit 4 responds to the digital control signal and regulates the bias current signal inputted into the laser driver. In this embodiment, the detection resistor module 51 is a resistor R2.

Figure 2:
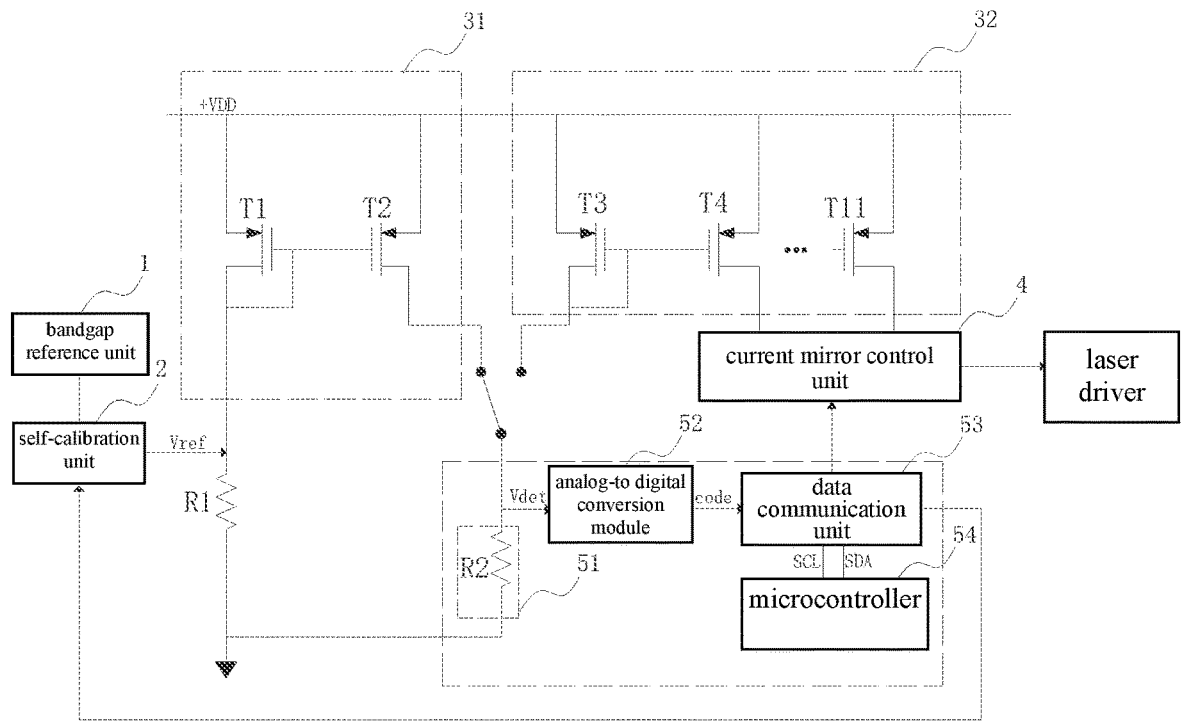
FIG. 2 is a state diagram of a detection process of the current self-checking regulation circuit based on voltage calibration according to this invention.
Figure 3:
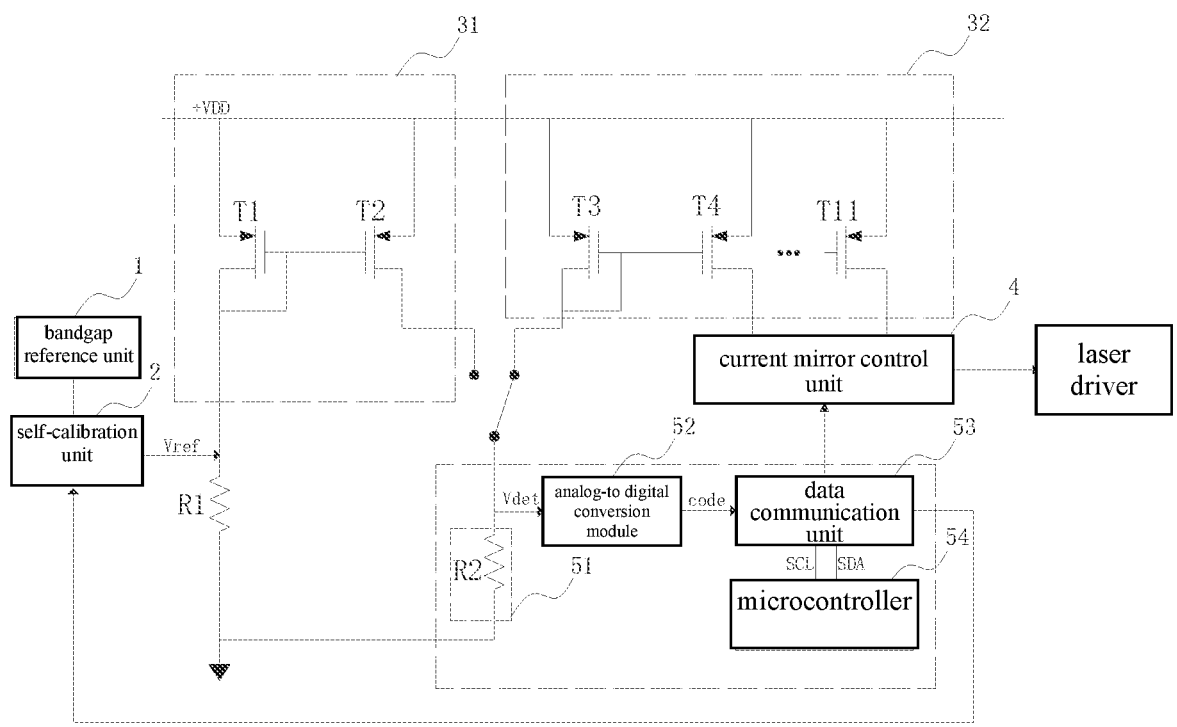
FIG. 3 is the other state diagram of the detection process of the current self-checking regulation circuit based on voltage calibration according to this invention.

Specifically, the reference group current mirror unit 31 includes a current mirror subunit T1 and a current mirror subunit T2, and the current mirror subunit T1 and the current mirror subunit T2 will generate a current I1; and the regulation group current mirror unit 32 includes nine current mirror subunits T3-T11 generating another current I2. The current of the current mirror subunit T1 and the current of the current mirror subunit T2 are the same, as the current mirror itself is capable of completely mirroring the current. Therefore, as shown in FIG. 2, when a control switch is connected with the current mirror subunit T2, and the reference current signal I1 outputted by the current mirror subunit T2 is added to the detection resistor module 51 R2 of the detection and regulation unit 5, a sampled voltage vdet will be generated, which is recorded as vdet1; this sampled voltage will be outputted to the analog-to-digital conversion module 52, and digital signal output is obtained, which is recorded as code1. As shown in FIG. 3, when the control switch is connected with the current mirror subunit T3, and the mirror current signal I2 (Since the current mirror subunit T3 and the current mirror subunits T4-T11 are current mirrors in the same environment, it is considered that the current I2 flowing from T3 and the source current of the current mirror control unit 4 taken by the VCSEL are mirror images) outputted by the current mirror subunit T3 is added to the detection resistor module 51 R2 of the detection and regulation unit 5, a new sampled voltage vdet2 will be generated, and this sampled voltage will be outputted to the analog-to-digital conversion module 52 to obtain new digital signal output, which is recorded as code2. Since code1 and code2 are digital current output generated by adding different currents to the same resistor (i.e. detection resistor module 51R2) through the same analog-to-digital conversion module 52, the mirror current signal I2 can be obtained by simply calculating the difference between code1 and code2. After the above-mentioned steps are completed, the detection function of the current is completed. Then through the communication of the microcontroller 54 and the data communication module 53, the digital control signal is inputted to the current mirror control unit 4 to control the bias current inputted into the laser driver, that is, the regulation step is completed.

This invention simplifies an entire process of detecting and regulating the current, and does not need to calibrate the ADC before detecting the current; and the reference current generated by the current source is optimized such that the current source does not change with the temperature of the process of the internal resistor, and the internal generated current is consistent with the external read current.

The specific embodiments described above further explain objectives, technical solutions, and beneficial effects of this invention, and it is understood that the above-mentioned description is only the embodiment of this invention and is not intended to limit the protection scope of this invention. It should be noted that for those skilled in the art, any made modifications, equivalent replacement, improvements, etc. within the spirit and principle of this invention are intended to be included in the protection scope of this invention.

What is claimed is:

1. A current self-checking regulation circuit based on voltage calibration, comprising:
    a reference group current mirror unit;
    a detection and regulation unit;
    a regulation group current mirror unit;
    wherein the detection and regulation unit comprises an analog to digital conversion module, a data communication module, a microcontroller and a detection resistor module;
    wherein a second end of the detection resistor module is connected to a second end of a first resistor, the second end of the detection resistor module and the second end of the first resistor are connected to a ground potential;
    the first end of the detection resistor module is connected to a switch and to the analog to digital conversion module;
    a reference voltage is applied to the first end of the first resistor;
    the switch is first connected to the reference group current mirror unit followed by a connection to the regulation group current mirror unit;
    wherein a current value is generated by the detection and regulation module based on the differences between the current from the reference group current mirror unit and the regulation group current mirror unit such that the current value does not fluctuate even if the resistance value of the detection resistor module fluctuates.

2. The current self-checking regulation circuit based on voltage calibration according to claim 1;
    wherein the detection resistor module is coupled with the reference group current mirror unit and the regulation group current mirror unit, the analog-to-digital conversion module is arranged between the detection resistor module and the data communication module, and the data communication module is coupled with the microcontroller, and
    wherein when the detection resistor module is turned on and connected with the reference group current mirror unit, according to the reference current signal, a first sampled signal is generated and inputted into the analog-to-digital conversion module;
    wherein when the detection resistor module is turned on and connected with the regulation group current mirror unit, according to the mirror current signal, a second sampled signal is generated and inputted into the analog-to-digital conversion module, according to the first sampled signal and the second sampled signal, the data communication module completes detection of a value of the mirror current signal, at the same time the microcontroller communicates with the data communication module to generate a digital control signal, the digital control signal to be used to determine a bias current for a laser driver.

3. The current self-checking regulation circuit based on voltage calibration according to claim 1, wherein the regulation group current mirror unit comprises nine current mirror subunits.

4. The current self-checking regulation circuit based on voltage calibration according to claim 2, wherein the detection resistor module is a resistor.

* * * * *